(12) United States Patent
Kirschner (10) Patent No.: US 11,495,313 B1
(45) Date of Patent: Nov. 8, 2022

(54) FAIL-SAFE IC PRODUCTION TESTING

(71) Applicant: NUVOTON TECHNOLOGY CORPORATION, Hsin-chu (TW)

(72) Inventor: Yuval Kirschner, Even Yehuda (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 17/463,631

(22) Filed: Sep. 1, 2021

(51) Int. Cl.
 G11C 17/18 (2006.01)
 G11C 29/02 (2006.01)
 G11C 17/16 (2006.01)

(52) U.S. Cl.
 CPC .............. *G11C 17/18* (2013.01); *G11C 17/16* (2013.01); *G11C 29/027* (2013.01)

(58) Field of Classification Search
 CPC ....................................................... G11C 17/18
 USPC ............................................................. 365/96
 See application file for complete search history.

(56) References Cited

U.S. PATENT DOCUMENTS

| | | | |
|---|---|---|---|
| 7,249,109 B1 * | 7/2007 | Silverbrook | G06F 21/755 705/64 |
| 8,650,446 B2 | 2/2014 | Byom et al. | |
| 2009/0327684 A1 * | 12/2009 | Zimmer | G06F 21/575 713/2 |
| 2017/0040067 A1 | 2/2017 | Byun et al. | |

OTHER PUBLICATIONS

West,"Advanced Test Methodology and Strategies for Semiconductors," Proceedings of the 13th International Symposiumon Physical and Failure Analysis (IPFA),pp. 119-124,year 2006.*

* cited by examiner

*Primary Examiner* — Muna A Techane
(74) *Attorney, Agent, or Firm* — Kligler & Associates Patent Attorneys Ltd (57) ABSTRACT

An integrated circuit (IC) includes a non-volatile memory and boot circuitry. The boot circuitry is configured to boot the IC, including reading from the non-volatile memory one or more values indicative of whether production testing of the IC was completed successfully, and initiating a responsive action if the one or more values indicate that the production testing was not completed successfully.

16 Claims, 4 Drawing Sheets

FAIL-SAFE IC PRODUCTION TESTING

FIELD OF THE INVENTION

The present invention relates generally to integrated circuit testing, and particularly to methods and systems for using Non-Volatile Memory to improve the quality of integrated circuit testing.

BACKGROUND OF THE INVENTION

Integrated circuits (ICs) may be tested at the wafer-level ("wafer-sort") and at the packaged-unit level. The tests may include calibration, personalization, serial-number insertion etc.).

In "Advanced Test Methodology and Strategies for Semiconductors," B. G. West (Proceedings of 13th IPFA, 2006, Singapore), the author describes how the focus in high-end device testing has shifted in recent years from precise measurement to data management, and then proceeds to describe a Transaction-Based Automatic Test Equipment (ATE) architecture.

U.S. Patent Application Publication 2017/0040067 discloses a method of testing a semiconductor integrated circuit including a one-time programmable (OTP) memory device. A program command is transferred from a tester to the OTP memory device. Programming and a programming verification are performed with respect to OTP memory cells in the OTP memory device in response to the program command.

SUMMARY OF THE INVENTION

An embodiment of the present invention that is described herein provides an integrated circuit (IC) including a non-volatile memory and boot circuitry. The boot circuitry is configured to boot the IC, including reading from the non-volatile memory one or more values indicative of whether production testing of the IC was completed successfully, and initiating a responsive action if the one or more values indicate that the production testing was not completed successfully.

In some embodiments, the one or more values consist of a single pass/fail bit. In some embodiments, the one or more values have been written to the non-volatile memory by an external Automatic Test Equipment (ATE). In some embodiments, the IC further includes control circuitry configured to receive from an external Automatic Test Equipment (ATE) information indicative of whether the production testing was completed successfully, and to write the one or more values to the non-volatile memory based on the information.

In an embodiment, the one or more values include one or more of (i) an irrecoverable test pass indication, (ii) an irrecoverable test fail indication, (iii) a recoverable test fail indication, and (iv) a recoverable test pass indication. In a disclosed embodiment, the one or more values are mutually orthogonal.

In some embodiments the non-volatile memory is a one-time-programmable (OTP) memory. In other embodiments the non-volatile memory is a multiple-time-programmable non-volatile memory (MTP DIM).

There is additionally provided, in accordance with an embodiment of the present invention, a method including booting an Integrated Circuit (IC) that includes a non-volatile memory, including (i) reading from the non-volatile memory one or more values indicative of whether production testing of the IC was completed successfully, and (ii) initiating a responsive action if the one or more values indicate that the production testing was not completed successfully.

The present invention will be more fully understood from the following detailed description of the embodiments thereof, taken together with the drawings in which:

DETAILED DESCRIPTION OF EMBODIMENTS

Overview

Integrated Circuit (IC) production testing (PT) is used to test the IC after manufacturing and screen-out the defective parts. Typically, PT is also used for parameter tuning, calibration, insertion of individual serial numbers, and other personalization functions.

As would be evident, an IC that does not pass the PT successfully and completely should not be shipped to the customer. In practice, however, ICs that fail or skip PT are sometimes shipped to customers, due to human (or computer) error.

Re-test is a common practice in production testing; the production test sometimes fails due to a testing problem—e.g., bad contact between the IC pads and the ATE pads, or the use of a wrong temperature setting. In this case, the test may be repeated after the problem is found (and repaired).

Some defects may produce instable or marginal results; in this case, when the test is repeated, the test results may alternate between Pass and Fail. The user may define critical tests—which must not fail (and, if at any time fail, may indicate an IC production defect), and non-critical tests, which may occasionally fail. We will refer to the critical tests as "irrecoverable tests", and to the non-critical tests as "recoverable tests"; we will further refer to repeated executions of the same test as Test Iterations.

Embodiments according to the present invention that are disclosed herein provide for devices and methods having improved quality production test, wherein the test results may be automatically tested when the IC boots, or, alternatively, verified during incoming test of the IC by the IC user.

In some embodiments, the IC comprises a One-Time-Programmable (OTP) memory and stores the test results in preassigned OTP locations, wherein each test result (or test-iteration result) may be a Pass or a Fail, that are programmed in two separate OTP bits. In an embodiment, the IC comprises a Control Circuit that stores the results of recoverable and irrecoverable test iterations in OTP bits, in response to test result indications that the Control Circuit receives (e.g., from an ATE). In other embodiments, the ATE programs a single compound test result indication in the OTP, responsively to the results of all the recoverable and irrecoverable test, and a control circuit may not be needed for programming of test-result indications. In some embodiments, the disclosed functionality of the control circuit need not necessarily be carried out by dedicated hardware. Such functionality may be performed, for example, by a processor (e.g., CPU or controller) in the IC.

In an embodiment, when booting, boot circuitry in the IC checks the corresponding OTP bits to verify that, for all the irrecoverable tests, all iteration results are Pass; and, for all the recoverable tests, at least one iteration result is a Pass. In another embodiment the there is no control circuit; the IC, when booting, checks the results of the multiple test result bits (or the status of the compound test result indication).

In some embodiments, the OTP comprises OTP words, including OTP words that are allocated for storing the test-results ("test result words"); each test-result word comprises a plurality of fields (e.g., one-bit fields), for storing the results of a plurality of iterations of the test. The IC always programs a Pass field or a Fail field in the OTP word, according to the test-iteration result. In embodiments, the fields that are used to store Pass or Fail results are orthogonal (e.g., separate fields). In an embodiment, Pass results may be programmed in odd bits of the OTP test-results word, whereas Fail results are programmed in even bits (or vice-versa). Thus, assuming the OTP word is 16 bits, if a test-results word is 16x5555, the test has passed eight times; if the word is 16xAAAA, the test has failed 8 times; if the word is, for example, 5A55, the test has passed 6 times and failed twice (which may be acceptable for a recoverable test).

As would be appreciated, although we refer herein to stored test results, the results that are stored in the IC memory may be different from the actual test results; for example, in some embodiments, the accumulative result of a plurality of tests and personalization operations may be stored as a single "test result" word (which may include "pass" and "fail" indications) in memory.

In some embodiments, the IC does not comprise an OTP and, instead, comprises a non-volatile memory (NVM) which can be programmed (and erased) multiple times. The control circuit will store Pass and Fail results in separate fields; however, in embodiments wherein the NVM memory has to be erased prior to running the additional tests, the ATE first reads the test-results words from the NVM, temporarily stores the test-result words in a RAM, erases the NVM (or a segment of the NVM in which the test result words are stored) and then continues testing, storing the results in RAM (the same RAM that was used for temporarily storing the NVM results, or a different RAM). When the test is completed, the ATE restores the results in the IC's NVM (including results history that was stored in the temporary memory).

In summary, embodiments of the present invention significantly improve the quality of the IC test by storing test results in an NVM in the IC and by checking the test results in the NVM upon IC startup (e.g., boot); in some embodiments the IC includes a circuit that stores the test results in the NVM, whereas in other embodiments the ATE stores the test results in the NVM; in embodiments, results of individual tests, including pass and fail, are stored in the NVM, whereas in other embodiments only a compound test result is stored. In yet other embodiments, various combinations and sub-combinations of the embodiments described above may be used.

System Description

The embodiments disclosed herein refer to the testing of an integrated circuit (IC) having a non-volatile memory by the IC manufacturer, to the incoming inspection of the IC by the IC customer and to booting of the IC when assembled at a target system. The disclosed techniques, however, can also be used for the testing of systems, (e.g., a Multi-Chip Module, or MCM).

Figure 1:
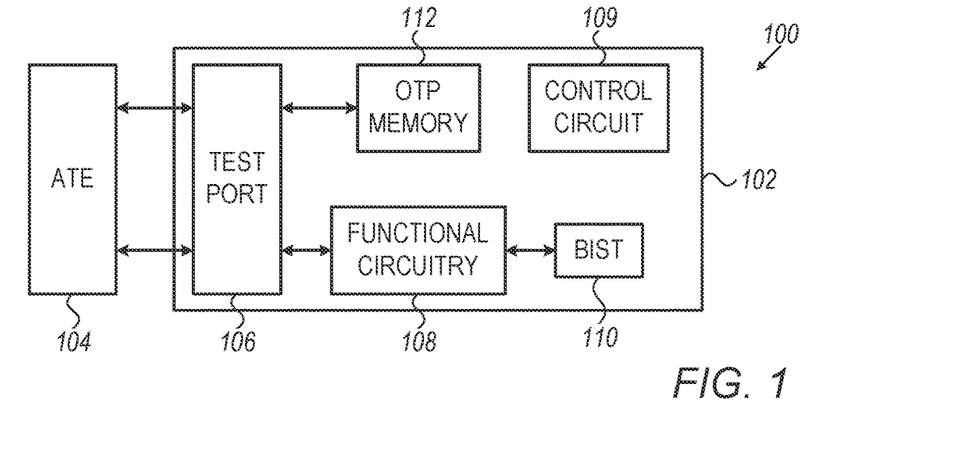
FIG. 1 is a block diagram that schematically illustrates a production testing system of an Integrated-Circuit (IC), in accordance with an embodiment of the present invention.

FIG. 1 is a block diagram that schematically illustrates production testing system 100 of an Integrated-Circuit (IC), in accordance with an embodiment of the present invention. An IC 102 is coupled to an Automatic Test Equipment 104, through a Test-Port 106 in the IC. The IC comprises Functional Circuitry 108, operable to implement the functionality of IC 102, and a Control Circuit 109. The ATE is configured to perform various tests of the functional circuitry; in some embodiments the tests may include personalization of the IC, such as calibration, parameter programming, serial number programming and insertion of security keys.

In some embodiments, IC 102 comprises a Built-In Self-Test (BIST) circuit 110, which is operable to run tests of functional unit 108, under the control of ATE 104. (BIST circuits are widely used in the industry, e.g., for memory testing. In some embodiments, the BIST circuit is also used during device boot; in an embodiment a BIST test may be triggered by software command, by hardware command, or responsively to detection of predefined conditions.)

According to the example embodiment illustrated in FIG. 1, IC 102 comprises a One-Time-Programmable (OTP) memory 112 (e.g., a fuse memory), and the control circuit is configured to program the test results in the OTP memory (in other embodiments, an ATE programs the OTP and a control circuit may not be needed). Thus, if, due to a human or computer error, the IC manufacturer ships an IC which failed (or skipped, fully or partially) the production test, the IC customer will detect the error either during an incoming inspection or when the IC boots (this will be further described below).

Thus, by programming the test results in an embedded OTP memory, and by testing the test results that are stored in the OTP at a customer site, the quality of shipped ICs may be enhanced.

As would be appreciated, the structures of IC 102 and of production testing system 100, illustrated in FIG. 1 and described hereinabove, are example structures cited for clarity. Other suitable structures may be used in alternative embodiments. For example, BIST 110 may comprise a RAM which stores the BIST code; the ATE may write the code into the BIST RAM during testing. In another example, a single ATE may concurrently test a plurality of ICs.

In some embodiments, Control Circuit 109 is operable to program any or all OTP bits, including test results responsively to indications from an ATE, and including other bits (e.g., calibration data or security keys), responsively to indications from the ATE and/or from any other source (e.g., from an embedded processor).

In the example embodiment illustrated in FIG. 1 and described hereinabove, IC 100 includes a control circuit 109 to program the NVM with the test results; in alternative embodiments, however, an external ATE directly programs of the NVM with the test results, and control circuit 109 may not be required.

Figure 2:
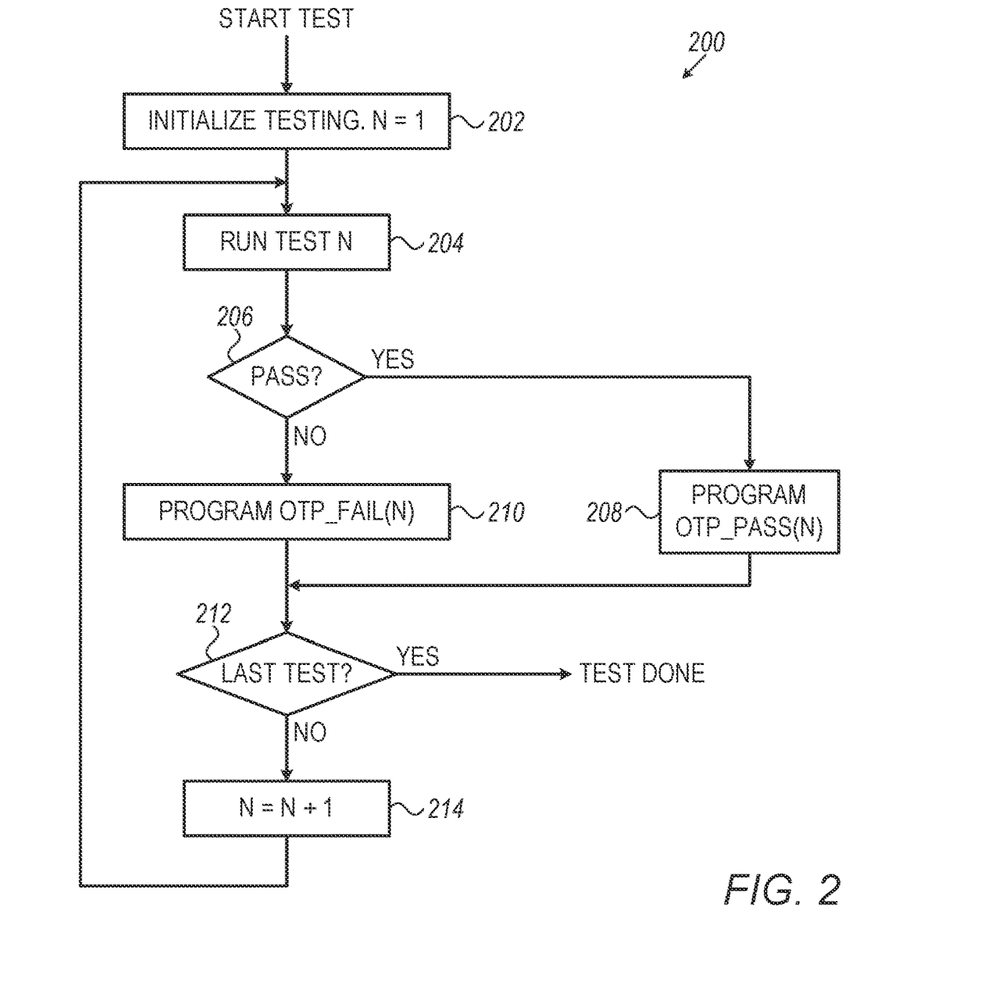
FIG. 2 is a flowchart that schematically illustrates a first method for IC production testing, in accordance with an embodiment of the present invention.

FIG. 2 is a flowchart 200 that schematically illustrates a method for IC production testing, in accordance with an embodiment of the present invention. The flowchart is executed by Control Circuit 109 and by ATE 104 (FIG. 1). It is assumed that a user (e.g., a product engineer) has predefined a set of tests).

The flowchart starts at an Initialize-Test step 202, wherein the ATE sets the test number N to 1 (N may be a software variable, or a register). As would be appreciated, in Initialize Test step 202, ATE 104 may execute other test initialization functions, e.g., setting voltage and timing thresholds).

Next, at a Run-Test-N step 204, the ATE runs the predefined Test-N (which may occasionally involve the activation of BIST 110, FIG. 1). The ATE then enters a Check-Pass step 206, and checks if Test N has passed (e.g., by examining a Test-Pass pad of BIST 110). If the test passed, the Control Circuit enters a Program-Pass step 208, and programs a pre-designated bit of OTP 112 to indicate that Test N has passed. If, in step 206, the test has failed, the Control Circuit enters a Program-Fail step 210 and programs a pre-designated bit of the OTP that indicates that Test N has failed. (Although the description above refers to programming of OTP bits to indicate a test-pass or a test-fail, in some embodiments the indication is programmed in an OTP field that may be greater than one bit.)

After both steps 208 and 210, the ATE enters a Check-Last step 212 and checks if N is the last predefined test. If so, the testing flowchart completes. If N is not the last test, the ATE increments N in an Increment-N step 214, and the reenters step 204, for the next test.

Thus, according to the example embodiment illustrated in FIG. 2 and described herein, the Control Circuit stores all test results, including test-pass indications and test-fail indications, in on-chip OTP.

As would be appreciated, the flowchart illustrated in FIG. 2 and described herein is an example that is cited for the sake of conceptual clarity. Other suitable flowcharts may be used in alternative embodiments. For example, in some embodiments, test N may automatically repeat if fails (after step 210, the ATE may reenter step 204, looping for a preset number of test-retries (iterations); the results of such test iterations may be stored in more OTP bits).

In some embodiments, the ATE keeps track of the pass and fail indications, and the results of the test can be displayed (or otherwise communicated) to the user without reading the corresponding OTP fields.

In some embodiments IC 100 does not comprise a control circuit 109, and the ATE executes the entire flowchart 200.

Recoverable and Irrecoverable Tests

According to embodiments of the present invention, production tests may include tests that must never fail, as well as tests that may occasionally fail (e.g., a test may fail due to IC or tester lead contamination but may then pass when the contamination is cleaned). We will refer to the former tests as irrecoverable tests, and to the latter as recoverable tests. For example, BIST tests are typically considered irrecoverable tests, whereas continuity tests are typically recoverable; parameterized tests may be recoverable if the parameter is marginal and, for example, the temperature setting is inaccurate.

In embodiments, the Control Circuit programs the OTP with test-pass and test-fail indications. In some embodiments, the user defines a list of recoverable and irrecoverable tests; in an embodiment, for each recoverable test the user defines a maximum allowed number of failures in iterations of the same test, and in another embodiment the user defines a limit ratio of pass to fail test iterations (e.g., for a given recoverable test, the number of passing test iterations should be at least 90% of the total number of test iterations). In yet other embodiments, for some recoverable tests, a single test iteration should pass.

Figure 3:
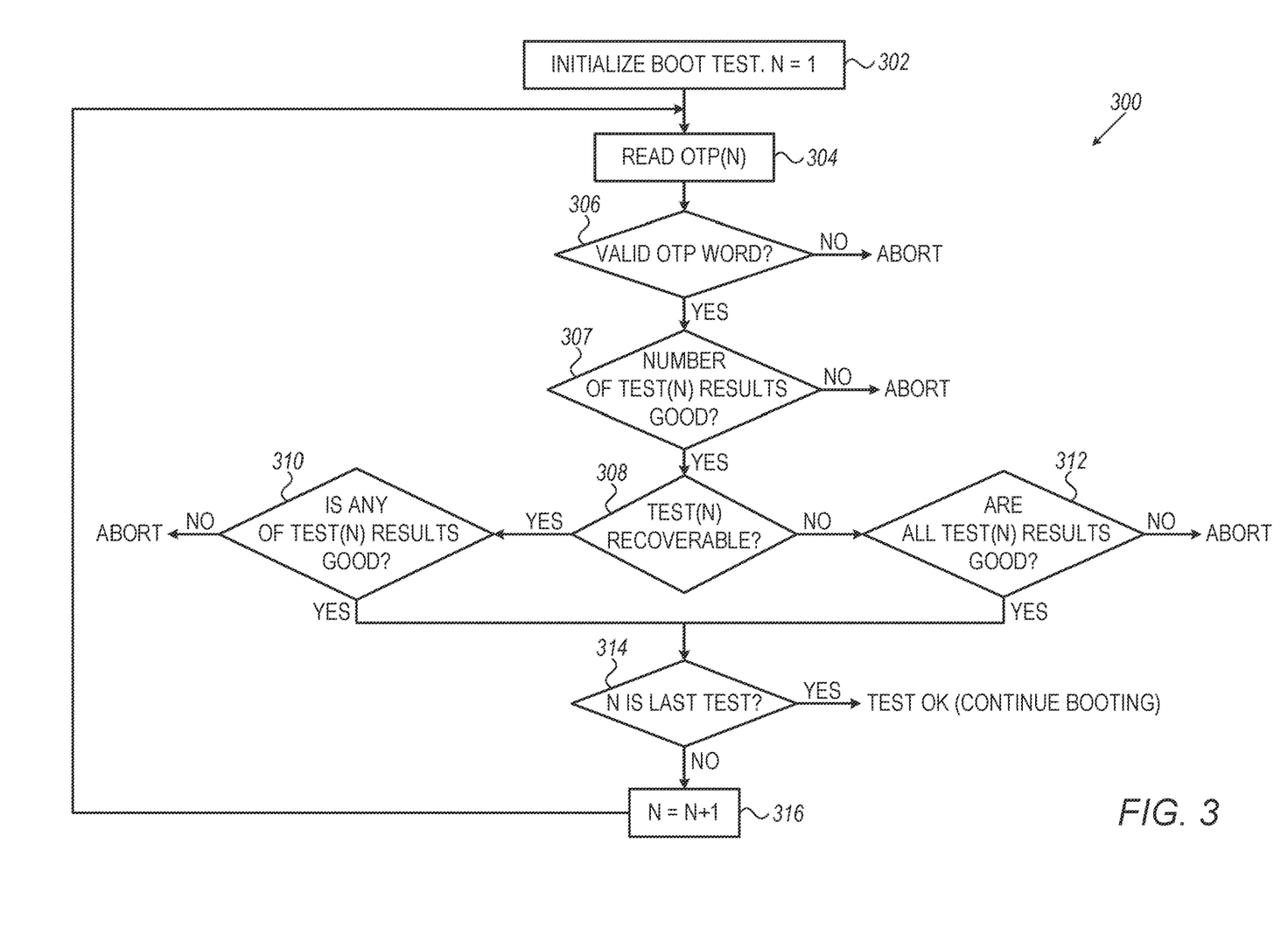
FIG. 3 is a flowchart that schematically illustrates booting of a pre-tested IC, in accordance with an embodiment of the present invention.

FIG. 3 is a flowchart 200 that schematically illustrates booting of a pre-tested IC, in accordance with an embodiment of the present invention. The flowchart is executed by Control Circuit 109 (FIG. 1) (IC 102 typically includes a processor that runs a boot sequence including flowchart 200; hence, Control Circuit 109 may refer to the processor and the corresponding part of the booting program). The description that follows assumes that the method is carried out by the disclosed control circuit. More generally, the method can be carried out by any suitable boot circuitry that boots the IC.

As described above, the IC comprises OTP words which store the results of the production test that the IC manufacturer has run. We assume that each OTP word stores the results of all iterations of a single test.

The flowchart starts at an Initialize-Boot-Test step 302, wherein the Control Circuit sets a test-number parameter (e.g., a register) to the value of 1 (the test number is referred to as N). Next, at a Read OTP word step 304, the Control Circuit reads from the OTP the test result word that corresponds to test no. N.

In a Check-Valid step 306, the Control Circuit then checks if the stored OTP word is valid. For example, if neither the test-pass nor the test-fail indications are programmed, the word is not valid (other examples of non-valid OTP words will be described below, with reference to FIG. 4). If the OTP word is not valid, booting aborts. Additionally or alternatively the control circuit may take any other suitable responsive action if the OTP word is not valid.

If, in step 306, the OTP word is valid, the Control Circuit enters a Check-Number-of-Results step 307, wherein the Control Circuit checks if the number of results stored for test-N equals a preset number-of-results value for the test (the number of results includes both pass and fail results pertaining to test-N). If the number of results is different from the preset value, the booting will abort. In some embodiments, the list of recoverable and irrecoverable tests is stored in a non-volatile memory; in other embodiments, the list may be read from an external memory device at a boot stage that precedes the boot-test.

If, in step 307, the number of results equals the preset value, the Control Circuit will enter a Check Recoverable step 308, and checks if test-N is recoverable If, in step 308, test N is irrecoverable, the Control Circuit will enter a Check-All-Good step 310, and check that, in case multiple iterations of test-N were run, all iterations have passed (e.g., all corresponding field of the OTP word are set). If any of the test runs failed, the Control Circuit will indicate a boot-error and abort the boot, or take other suitable responsive action.

If, in step 308, test-N is recoverable, the Control Circuit will enter a Check-Any-Good step 310, wherein the Control Circuit will check that, if multiple iterations of test-N were run, any of the iterations passed. If all iterations failed, the Control Circuit will, again, indicate a boot-error, and abort the boot.

If, in step 312, all test iterations have passed, or, in step 310, any of the test iterations has passed, the Control Circuit will enter a Check-Last step 314, and check if N is the last test (the number of tests may be, for example, preset). If so, the boot-test has completed successfully, and the IC will proceed to execute other boot functions. If, in step 314, N is not the last test, the Control Circuit will, in an Increment-N step 316, increment the value of N, and then reenter step 304, for the next test.

Thus, according to the example embodiment illustrated in FIG. 3 and described above, an IC which has been programmed with the production test results can, during boot, verify that a production test of the IC has been successfully run by checking that all iterations of each irrecoverable test, and at least one iteration of each recoverable test, have passed.

As would be appreciated, the flowchart illustrated in FIG. 3 and described herein is an example that is cited for the sake of conceptual clarity. Flowcharts according to the present invention are not limited to the illustration and description herein. For example, in some embodiments, a single compound test result is stored in the NVM, and flowchart 300 is shortened accordingly. In embodiments, the IC is not a processor and cannot boot; rather, the flowchart is executing by an incoming inspection system that comprises a processor and a zero-insertion-force (ZIF) socket, into which incoming ICs are plugged.

In other embodiments, flowchart 300 is executed by a processor of functional circuitry 108, as part of the booting sequence of the IC; in an embodiment, the processor will access the control circuitry to read the test results from the NVM.

In some embodiments, a fail-limit number is defined for the iterations of various recoverable tests and the IC checks that the number of fail indications does not exceed the limit. In an embodiment, the Control Circuit compares the ratio of pass to fail iterations of the recoverable tests and compares the ratio to a preset limit.

Figure 4:
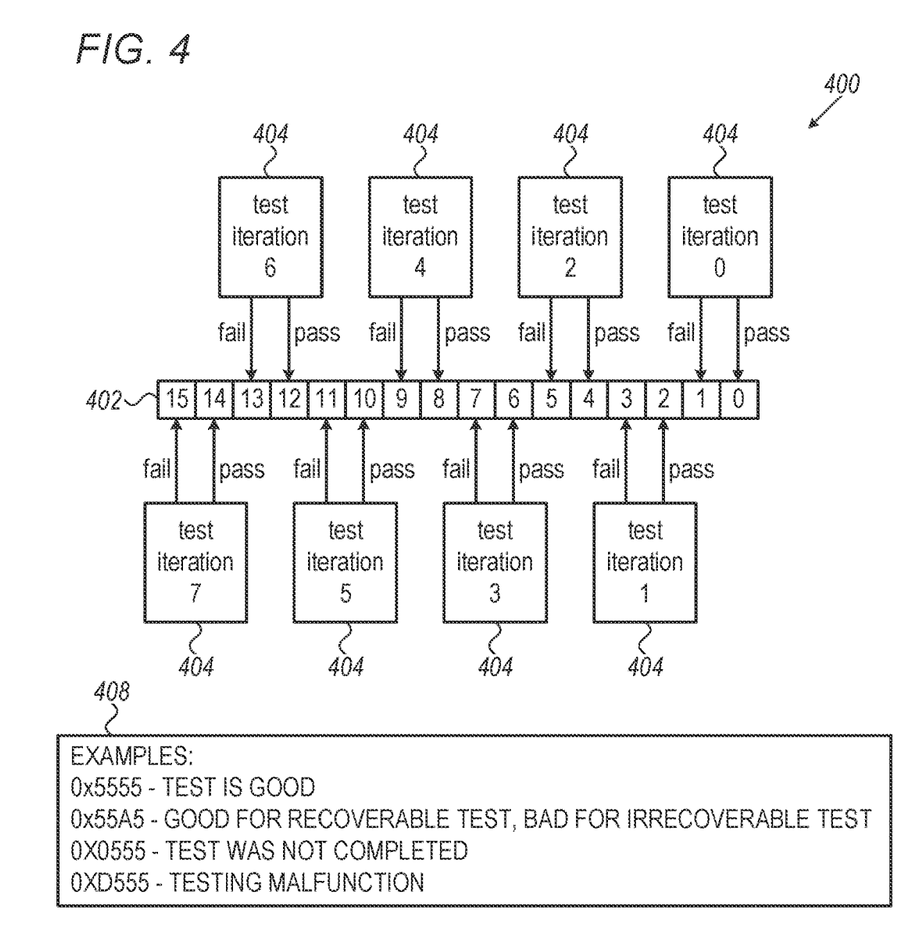
FIG. 4 is a block diagram that schematically illustrates orthogonal programming of test results in a One-Time-Programmable (OTP) memory, in accordance with an embodiment of the present invention.

FIG. 4 is a block diagram 400 that schematically illustrates the structure of orthogonal programming of test results in a One-Time-Programmable (OTP) memory, in accordance with an embodiment of the present invention. According to the example embodiment illustrated in FIG. 4, each test is allocated a 16-bit OTP word 402, which may be used to store eight pass or fail results of eight test iterations, numbered 0 through 7. When an iteration 404 fails, an odd-numbered bit of OTP 402 is programmed; when the test iteration passes, an even bit of the OTP word is programmed. In the first iteration, either bit 0 or bit 1 is programmed; in the second iteration, either bit 2 or bit 3 are programmed, and so on.

It should be noted that the even bits and the odd bits are mutually orthogonal and, thus, the Fail records and the Pass records cannot impact each other.

Some examples to possible OTP words are shown in an Example-Box 408. In a first example, the OTP word is 0x5555—all even bits are programmed, which means that all eight iterations of the test passed. In a second example, the OTP word is 0x55A5. Even bits 0,2,8,10,12 and 14 are programmed, but so are odd bits 5 and 7. The test has passed in 6 iterations and failed in two (this may deem the IC bad for an irrecoverable test, and good for a recoverable test).

In a third example, the OTP word is 0x0555. Even bits 0, 2, 4, 6, 8 and 10 are programmed, but none of bits 12 through 15 are programmed. According to the example embodiment illustrated in FIG. 4, all tests must include at least eight test-pass or test-fail iterations; thus, a 0x0555 OTP word indicates that the test was not completed.

In a fourth example, the test result OTP word is 0xD555. This means that test iterations 0 through 6 passed, but in test iteration 7 both the Pass bit (14) and the Fail bit (15) are set, and, hence, the testing procedure was corrupted.

As would be appreciated, the structure of orthogonal programming illustrated in FIG. 4 and described hereinabove is an example structure; other structures may be used in alternative embodiments. For example, in some embodiments, separate words are allocated for storing Pass results and Fail results of each test. In some embodiments, the number of iterations for each test is not fixed and may vary according to the test. In an embodiment, irrecoverable tests do not have OTP cells that store a Fail test result —instead, in the case that an irrecoverable test fails, a global Fail bit will be programmed, and testing will be aborted.

Using Multiple-Time Programmable Non-Volatile Memory

Although the descriptions hereinabove refer to storing of the test results in an on-chip one-time-programmable (OTP) non-volatile memory (NVM), the described techniques may also be used when the IC comprises a multiple-time programmable NVM ("MTP" hereinbelow), or when the IC comprises both an OTP and an MTP, but using of the MTP is preferable (e.g., if the OTP size is limited).

When an MTP is used for storing of the test results, care should be taken not to lose stored test results in a manufacturing stage wherein the entire NVM is erased (which is not possible for OTP).

Figure 5:
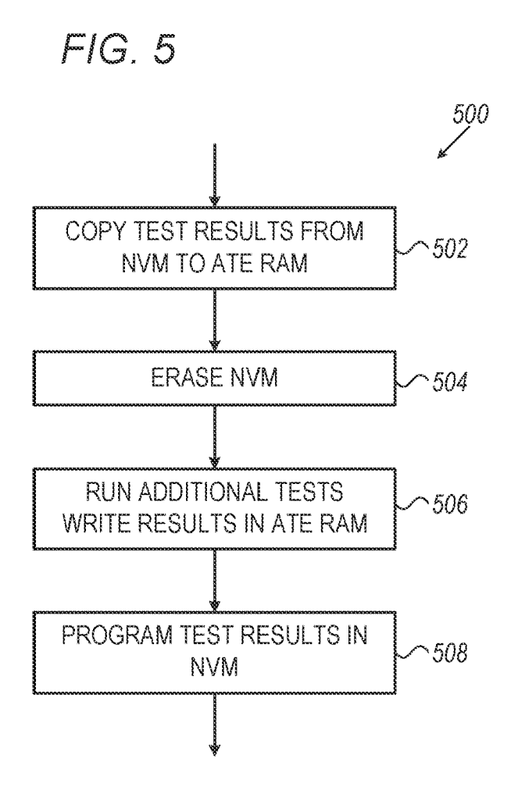
FIG. 5 is a flowchart that schematically illustrates a method for IC testing using a multiple-time-programmable non-volatile memory (MTP-NVM), in accordance with an embodiment of the present invention.

FIG. 5 is a flowchart 500 that schematically illustrates a method for IC testing using a multiple-time-programmable non-volatile memory (MTP-NVM), in accordance with an embodiment of the present invention. According to the example embodiment illustrated in FIG. 5, the IC is to undergo a new set of tests, which should augment rather than replace the results of previous test cycles. We assume that the test must start with an erasure of the complete NVM.

The flowchart is executed by ATE 104 (FIG. 1) and starts in a Copy-Test-Results step 502, wherein the ATE reads the accumulated results of previous tests from the MTP NVM and stores the results in a Random-Access Memory (RAM). Next, in an Erase NVM step 504, the ATE erases the complete contents of the NVM. The ATE then enters a Run-Additional-Tests step 506. Step 506 is similar to flowchart 200 (from step 204), except that the Fail (step 210) and the Pass (step 208) are programmed in the ATE RAM.

Next, at a Program-NVM step 508, the ATE copies the updated test results from the ATE RAM to the MTP NVM, and the flow ends.

Thus, using temporary RAM storage for the test results, enhanced testing can be achieved using an MTP NVM in lieu of an OTP.

As would be appreciated, the flowchart illustrated in FIG. 5 and described hereinabove is an example flowchart; other flowcharts may be used in alternative embodiments. For example, in some embodiments, after the MTP MVM is erased, the copy of the test results, which is stored in the ATE RAM, is copied back to the MTP NVM, and the results of further testing are written to the MTP NVM.

Figure 6A:
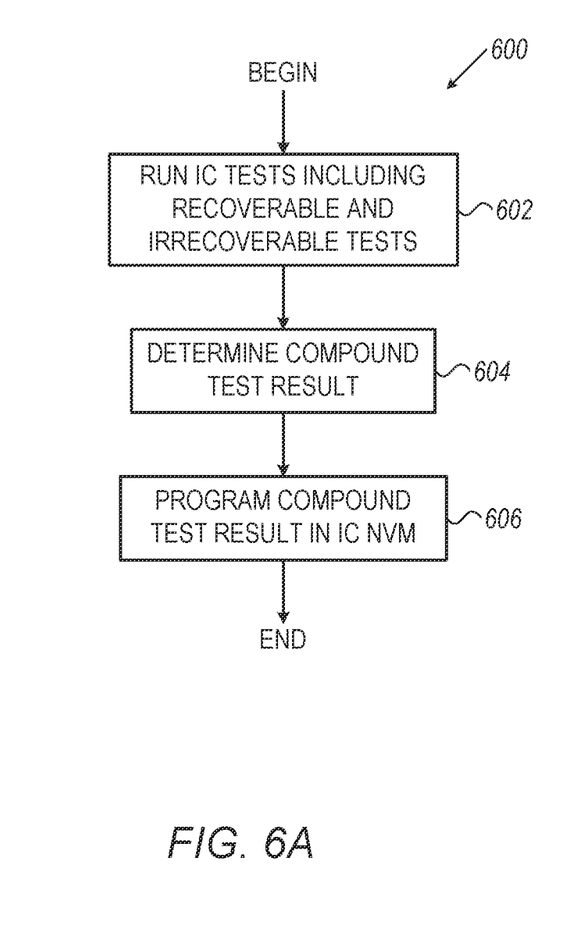
FIG. 6A is a flowchart that schematically illustrates a second method for IC production testing, in accordance with an embodiment of the present invention.

FIG. 6A is a flowchart 600 that schematically illustrates a second method for IC production testing, in accordance with an embodiment of the present invention. The flowchart is executed by ATE 104, which is coupled to IC 100 (FIG. 1); according to the example embodiment illustrated in FIG. 6A, IC 102 does not require a control circuit (unlike flowchart 200, FIG. 2).

The flowchart starts at a Run-IC Tests step 602, wherein the ATE runs various tests of IC 100. As explained above, the tests may include irrecoverable tests that must always pass, recoverable tests which may sometimes fail (but must pass at least once), and various non-test procedures such as calibration, personalization, etc.

Next, at a Determine Compound Test Result step 604, the ATE determines a compound test result, according to the results of the tests performed in step 602. The result may be either Pass or Fail.

Lastly, in a Program Compound Test result step 606, the ATE programs the compound test result in NVM memory 112, and the flowchart ends.

As would be appreciated, the flowchart illustrated in FIG. 6A is cited by way of example. Other suitable flowcharts may be used in alternative embodiments. For example, in an embodiment, ATE 104 may program all test results, in addition or instead of the compound test result, in NVM 112.

Figure 6B:
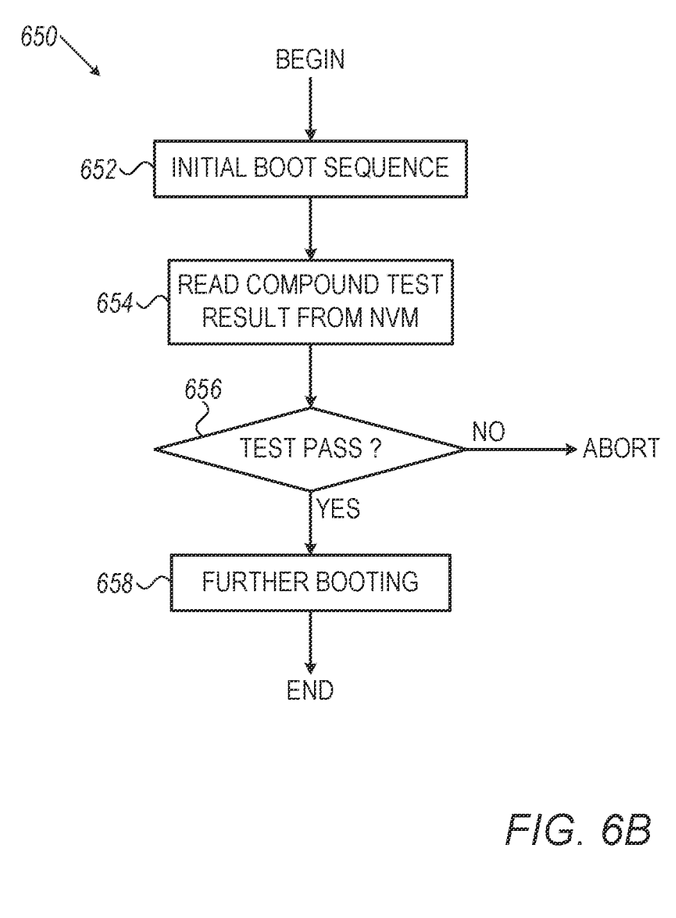
FIG. 6B is a flowchart that schematically illustrates an alternative booting of a pre-tested IC, in accordance with an embodiment of the present invention.

FIG. 6B is a flowchart 650 that schematically illustrates an alternative booting of a pre-tested IC, in accordance with an embodiment of the present invention. The flowchart is executed by IC 102 (e.g., by a processor in IC 102).

The flowchart starts at an Initial Boot Sequence step 652, wherein the IC runs initial booting tasks (e.g., running a BIST). Next, at a Read Compound Test Result step 654, the IC reads the compound test result (which has been programmed in the IC production test) from the NVM.

In a Check-Test-Pass step 656, the IC then checks if the read test result is a Pass. If so, the IC proceeds to a Further Booting step 658, executes additional booting tasks, and then exits the flowchart (boot is completed).

If, in step 656, the compound test result is a Fail, the IC aborts the boot (e.g., resets).

Thus, the reliability of the test substantially increases, by eliminating the possibility that an untested IC (or an IC which failed the test) will be used.

The configurations of production testing system 100, IC 102, OTP memory 112 and OTP word 400, flowcharts 200, 300, 500, 600 and 650, illustrated in FIGS. 1 through 5 and described hereinabove, are example configurations and flowcharts that are shown purely for the sake of conceptual clarity. Any other suitable configurations and flowcharts can be used in alternative embodiments. The different sub-units of IC 102 may be implemented using suitable hardware, such as in one or more Application-Specific Integrated Circuits (ASICs) or Field-Programmable Gate Arrays (FPGAs), using software, using hardware, or using a combination of hardware and software elements.

ATE 104 and/or IC 102 may comprise one or more general-purpose processors, which are programmed in software to carry out the functions described herein. The software may be downloaded to the processors in electronic form, over a network or from a host, for example, or it may, alternatively or additionally, be provided and/or stored on non-transitory tangible media, such as magnetic, optical, or electronic memory.

Although the embodiments described herein mainly address IC production test, the methods and systems described herein can also be used in other applications, such as in the production test of modules.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An integrated circuit (IC), comprising:
a non-volatile memory; and
boot circuitry, configured to boot the IC, including reading from the non-volatile memory one or more values indicative of whether production testing of the IC was completed successfully, and initiating a responsive action if the one or more values indicate that the production testing was not completed successfully.

2. The IC according to claim 1, wherein the one or more values consist of a single pass/fail bit.

3. The IC according to claim 1, wherein the one or more values have been written to the non-volatile memory by an external Automatic Test Equipment (ATE).

4. The IC according to claim 1, further comprising control circuitry configured to receive from an external Automatic Test Equipment (ATE) information indicative of whether the production testing was completed successfully, and to write the one or more values to the non-volatile memory based on the information.

5. The IC according to claim 1, wherein the one or more values comprise one or more of (i) an irrecoverable test pass indication, (ii) an irrecoverable test fail indication, (iii) a recoverable test fail indication, and (iv) a recoverable test pass indication.

6. The IC according to claim 1, wherein the one or more values are mutually orthogonal.

7. The IC according to claim 1, wherein the non-volatile memory is a one-time-programmable (OTP) memory.

8. The IC according to claim 1, wherein the non-volatile memory is a multiple-time-programmable non-volatile memory (MTP NVM).

9. A method, comprising booting an Integrated Circuit (IC) that includes a non-volatile memory, including:
reading from the non-volatile memory one or more values indicative of whether production testing of the IC was completed successfully; and
initiating a responsive action if the one or more values indicate that the production testing was not completed successfully.

10. The method according to claim 9, wherein the one or more values consist of a single pass/fail bit.

11. The method according to claim 9, wherein the one or more values have been written to the non-volatile memory by an external Automatic Test Equipment (ATE).

12. The method according to claim 9, further comprising receiving in the IC, from an external Automatic Test Equipment (ATE), information indicative of whether the production testing was completed successfully, and writing the one or more values to the non-volatile memory based on the information.

13. The method according to claim 9, wherein the one or more values comprise one or more of (i) an irrecoverable test pass indication, (ii) an irrecoverable test fail indication, (iii) a recoverable test fail indication, and (iv) a recoverable test pass indication.

14. The method according to claim 9, wherein the one or more values are mutually orthogonal.

15. The method according to claim 9, wherein the non-volatile memory is a one-time-programmable (OTP) memory.

16. The method according to claim 9, wherein the non-volatile memory is a multiple-time-programmable non-volatile memory (MTP NVM).

* * * * *